United States Patent
Li et al.

(10) Patent No.: US 8,248,840 B2
(45) Date of Patent: Aug. 21, 2012

(54) MAGNETORESISTIVE RANDOM ACCESS MEMORY (MRAM) WITH INTEGRATED MAGNETIC FILM ENHANCED CIRCUIT ELEMENTS

(75) Inventors: Xia Li, San Diego, CA (US); Seung H. Kang, San Diego, CA (US); Xiaochun Zhu, San Diego, CA (US); Kangho Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 215 days.

(21) Appl. No.: 12/732,531

(22) Filed: Mar. 26, 2010

(65) Prior Publication Data

US 2011/0233695 A1    Sep. 29, 2011

(51) Int. Cl.
*G11C 11/00* (2006.01)

(52) U.S. Cl. ..... 365/158; 365/171; 365/209; 365/225.5; 365/243.5

(58) Field of Classification Search ........... 365/158, 365/209, 225.5, 243.5, 171
See application file for complete search history.

(56) References Cited

U.S. PATENT DOCUMENTS

| | | | |
|---|---|---|---|
| 6,756,128 B2 * | 6/2004 | Carey et al. | 428/811.1 |
| 6,916,677 B2 * | 7/2005 | Nakajima et al. | 438/57 |
| 7,031,183 B2 * | 4/2006 | Kerszykowski et al. | 365/158 |
| 7,480,171 B2 * | 1/2009 | Peng et al. | 365/158 |
| 7,888,756 B2 * | 2/2011 | Mather et al. | 257/421 |
| 7,983,075 B2 * | 7/2011 | Takenaga et al. | 365/158 |
| 2006/0273418 A1 | 12/2006 | Chung et al. | |

OTHER PUBLICATIONS

International Search Report and Written Opinion—PCT/US2011/029989—ISA/EPO—Jul. 21. 2011.

* cited by examiner

*Primary Examiner* — Pho M Luu
(74) *Attorney, Agent, or Firm* — Sam Talpalatsky; Nicholas J. Pauley; Jonathan T. Velasco

(57) ABSTRACT

A Magnetoresistive Random Access Memory (MRAM) integrated circuit includes a substrate, a magnetic tunnel junction region, a magnetic circuit element, and an integrated magnetic material. The magnetic tunnel junction region is disposed on the substrate, and includes a first magnetic layer and a second magnetic layer separated by a tunnel barrier insulating layer. The magnetic circuit element region is disposed on the substrate, and includes a plurality of interconnected metal portions. The integrated magnetic material is disposed on the substrate adjacent to the plurality of interconnected metal portions.

32 Claims, 15 Drawing Sheets

$$\frac{V_P}{V_S} = \frac{I_S}{I_P} = \frac{N_P}{N_S}$$

MAGNETORESISTIVE RANDOM ACCESS MEMORY (MRAM) WITH INTEGRATED MAGNETIC FILM ENHANCED CIRCUIT ELEMENTS

FIELD OF DISCLOSURE

Disclosed embodiments are related to integrated circuits. More particularly, the embodiments are related to Magnetoresistive Random Access Memory (MRAM) with integrated magnetic film enhanced circuit elements, and methods of forming the same.

BACKGROUND

Inductive elements (also referred to as electromagnetic elements) are a group of circuit components that take advantage of various electromagnetic properties and are commonly used in a wide-range of integrated circuit applications. Transformers, for example, are used to transfer electrical energy from one circuit to another circuit through a shared magnetic field. The transformer is based on two principles: first, that an electric current can produce a magnetic field (electromagnetism), and second, that a changing magnetic field within a coil of wire induces a voltage across the ends of the coil (electromagnetic induction). By changing the current in the primary coil, the strength of the magnetic field is changed. Since the secondary coil is wrapped around the same magnetic field, a voltage is induced across the secondary coil. By adding a load to the secondary circuit, one can make current flow in the second circuit, thus transferring energy from one circuit to the other circuit.

FIGS. 1 and 2 illustrate schematic views of a simplified transformer design and circuit. In operation, a current passing through the primary coil creates a magnetic field. The primary and secondary coils are wrapped around a core of very high magnetic permeability, such as iron, which ensures that most of the magnetic field lines produced by the primary current are within the iron and pass through the secondary coil as well as the primary coil.

Increasing transformer efficiency and reducing size is important for circuit design and integration. One technique for increasing efficiency and reducing size is to integrate a magnetic material, such as a magnetic film (e.g., a ferromagnetic film such as CoFe, CoFeB, NiFe, etc.), on either end of the metal turns. The magnetic film can enhance the magnetic flux density B, which greatly increases the permeability and the electromotive force (EMF) of the transformer. Put another way, for a given EMF of the transformer, the integration of a magnetic film can reduce the size of the transformer and/or improve the transformer efficiency.

Such transformers and other inductive elements can be integrated into a logic/RF CMOS process by utilizing standard CMOS back-end process steps, such as metal deposition, dielectric deposition, and metal patterning in the CMOS foundry. However, magnetic films conventionally require advanced processing techniques that are more difficult to implement.

SUMMARY

Exemplary embodiments are directed to Magnetoresistive Random Access Memory (MRAM) with integrated magnetic film enhanced circuit elements.

In one embodiment, an MRAM integrated circuit includes a substrate, a magnetic tunnel junction region, a magnetic circuit element, and an integrated magnetic material. The magnetic tunnel junction region is disposed on the substrate, and includes a first magnetic layer and a second magnetic layer separated by a tunnel barrier insulating layer. The magnetic circuit element region is disposed on the substrate, and includes a plurality of interconnected metal portions. The integrated magnetic material is disposed on the substrate adjacent to the plurality of interconnected metal portions.

In another embodiment, a method of forming an MRAM integrated circuit includes: depositing and patterning a first magnetic layer, a tunnel barrier insulating layer, and a second magnetic layer to form a magnetic tunnel junction region on the substrate; depositing and patterning a plurality of interconnected metal portions to form a magnetic circuit element region on the substrate; and depositing and patterning a first integrated magnetic material on the substrate adjacent to the plurality of interconnected metal portions.

In another embodiment, an MRAM integrated circuit includes a substrate, a magnetic tunnel junction region, a magnetic circuit element, and first magnetic means for concentrating a magnetic field. The magnetic tunnel junction region is disposed on the substrate, and includes a first magnetic layer and a second magnetic layer separated by a tunnel barrier insulating layer. The magnetic circuit element region is disposed on the substrate, and includes a plurality of interconnected metal portions. The first magnetic means is disposed on the substrate adjacent to the plurality of interconnected metal portions.

In another embodiment, a method of forming a Magnetoresistive Random Access Memory integrated circuit includes: step for providing a substrate; step for depositing and patterning a first magnetic layer, a tunnel barrier insulating layer, and a second magnetic layer to form a magnetic tunnel junction region on the substrate; step for depositing and patterning a plurality of interconnected metal portions to form a magnetic circuit element region on the substrate; and step for depositing and patterning a first integrated magnetic material on the substrate adjacent to the plurality of interconnected metal portions.

BRIEF DESCRIPTION OF THE DRAWINGS

The accompanying drawings are presented to aid in the description of embodiments and are provided solely for illustration of the embodiments and not limitation thereof.

DETAILED DESCRIPTION

Figure 1:
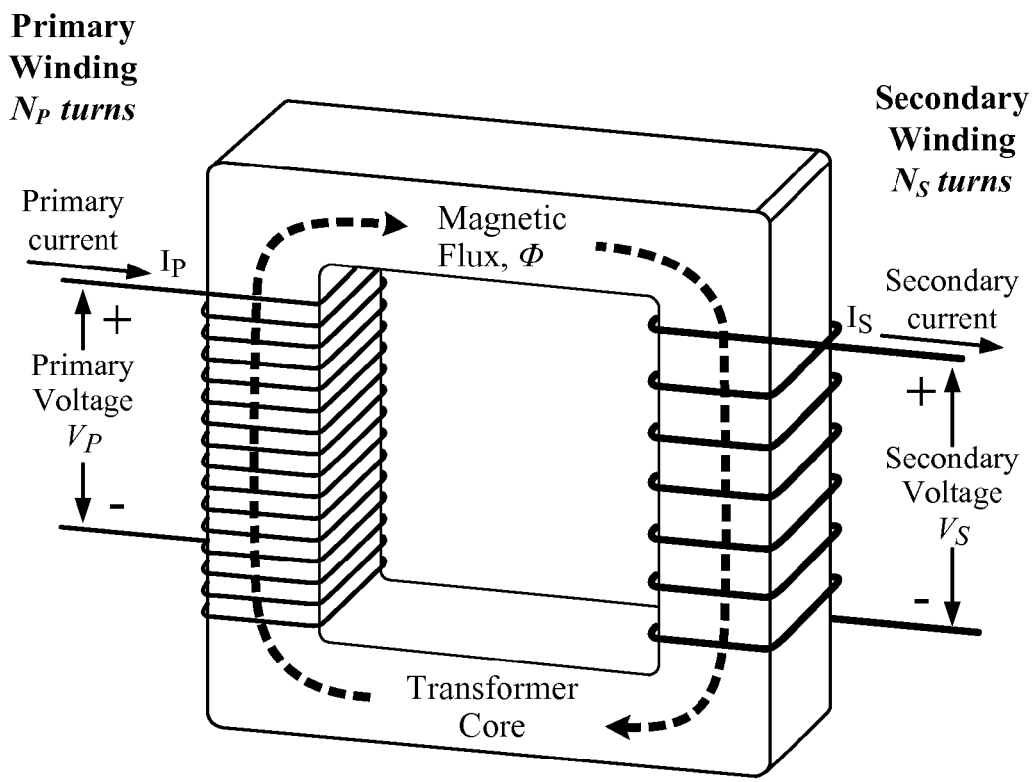
FIG. 1 is a perspective schematic view of a conventional transformer.
Figure 2:
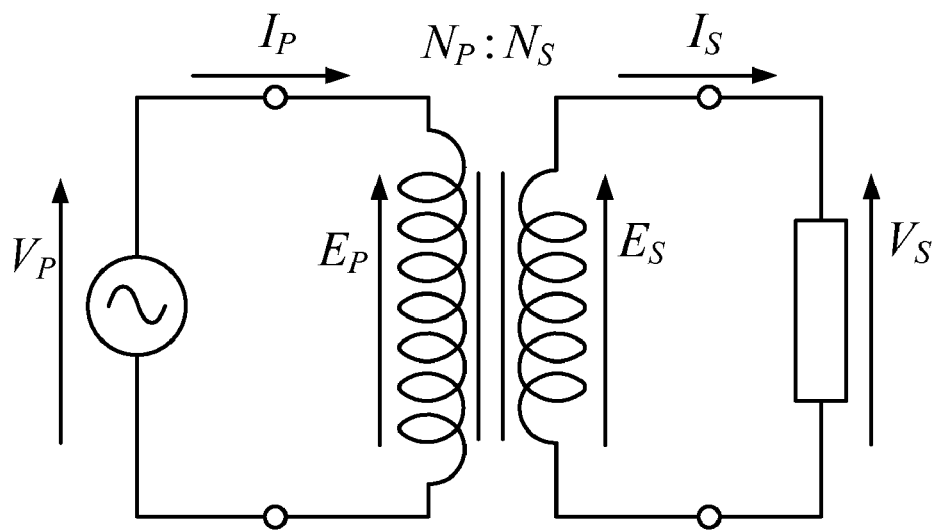
FIG. 2 is a schematic of a conventional transformer circuit.

Aspects of the embodiments are disclosed in the following description and related drawings directed to such embodiments. Alternate embodiments may be devised without departing from the scope of the invention. Additionally, well-known elements used and applied in the embodiments will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, blocks, steps, operations, elements, and/or components, but do not preclude the presence or addition of one or more other features, integers, blocks, steps, operations, elements, components, and/or groups thereof.

As discussed in the background, magnetic films (e.g., a ferromagnetic film such as CoFe, CoFeB, NiFe, etc.) can be advantageously integrated with magnetic circuit elements such as inductors, transformers, etc. Since the EMF of a transformer, for example, is proportional to the magnetic flux density B, number of turns N, and cross-section a, and the magnetic flux density B is proportional to the magnetic permeability, the permeability can be increased by implementing a magnetic material, such as a magnetic film, adjacent to the transformer metal portions to concentrate the magnetic field. The EMF of the transformer also can be increased by the same or similar amount. Thus, for a given EMF of the transformer, the integrated magnetic films such as those provided by the embodiments can reduce the size of the transformer and/or increase the transformer efficiency.

However, magnetic films conventionally require advanced processing techniques that are more difficult to implement than more common CMOS processing components. The disclosed embodiments recognize that magnetic films can be more efficiently formed if integrated with other magnetic devices, such as Magnetoresistive Random Access Memory (MRAM), in such a way that enables sharing of joint manufacturing processes (e.g., magnetic material deposition, magnetic annealing, magnetic film patterning, etc.). MRAM is a type of non-volatile computer memory that utilizes a Magnetic Tunneling Junction (MTJ) comprised of two ferromagnetic films, or plates, separated by a thin insulating layer to form magnetic storage elements. It will be recognized that the magnetic material may be any suitable material, combination of materials, or alloy that exhibits magnetic properties, such as a ferromagnetic material or a ferromagnetic thin film including CoFe, CoFeB, NiFe, etc. By sharing MRAM manufacturing processes with magnetic film integration techniques, the disclosed embodiments are able to more efficiently provide integrated magnetic field enhanced circuit elements.

Figure 3:
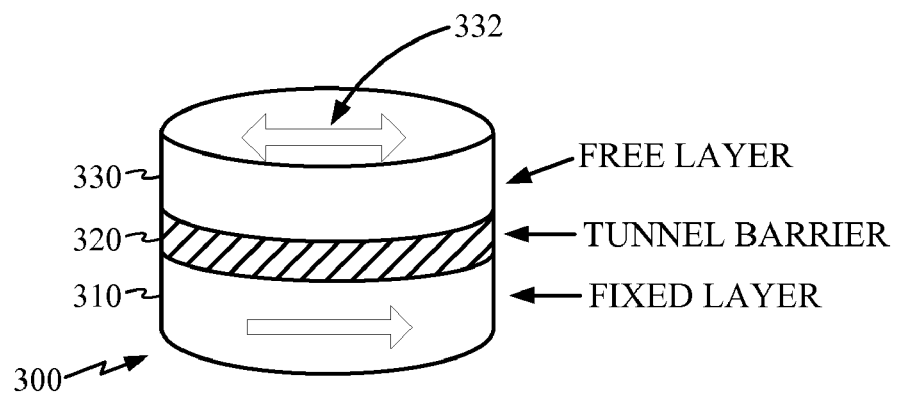
FIG. 3 illustrates a Magnetic Tunnel Junction (MTJ) storage element of a given Magnetoresistive Random Access Memory (MRAM) array.

FIG. 3 illustrates an MTJ storage element 300 of a given MRAM array that is formed from two magnetic layers 310 and 330, each of which can hold a magnetic moment, separated by an insulating (tunnel barrier) layer 320. One of the two layers (e.g., fixed layer 310 which is pinned by an antiferromagnetic (AFM) layer (not shown)), is set to a particular polarity. The other layer's (e.g., free layer 330) polarity 332 is free to change through the application of an external magnetic field, or by a spin torque transfer of perpendicular current passing through the MTJ plane. A change in the magnetic moment polarity 332 of the free layer 330 will change the resistance of the MTJ storage element 300. Each magnetic plate can hold a magnetic moment, and the reading of a storage element is accomplished by measuring the electrical resistance between the two plates when a current is passed through the junction. The magnetic plates are positioned parallel to each other and separated by a tunnel barrier material, which can be a magnesium-oxide, an aluminum-oxide, etc.

Figure 4:
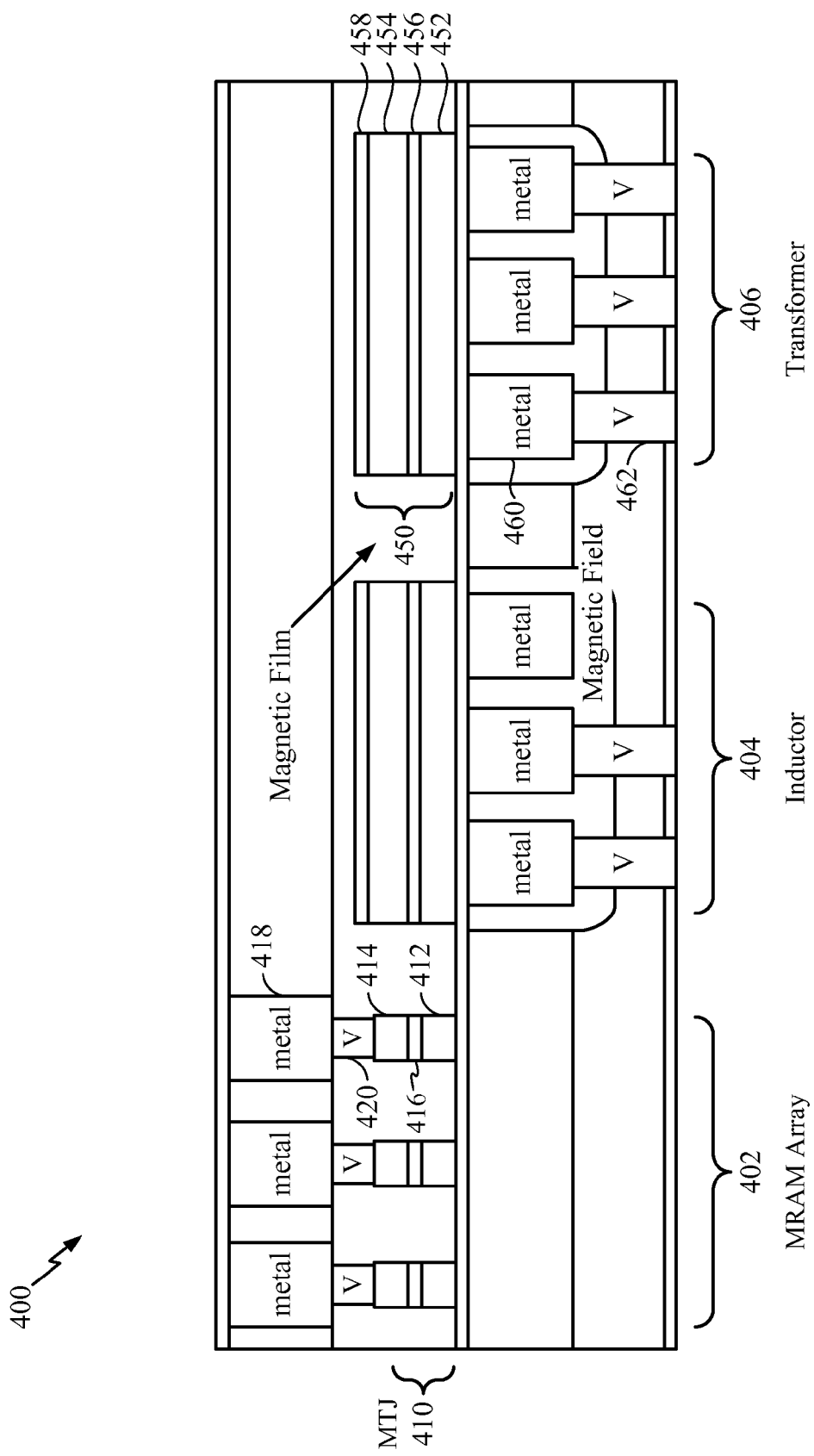
FIG. 4 illustrates an integrated circuit including an example MRAM array region, inductor region, and transformer region with a shared magnetic layer.

FIG. 4 illustrates an integrated circuit 400 including an example MRAM array region 402, inductor region 404, and transformer region 406 with a shared magnetic layer. As discussed in more detail above with reference to FIG. 3, the MRAM array region 402 can include one or more MTJs 410 formed from a first magnetic layer 412 and a second magnetic layer 414. The first and second magnetic layers 412, 414 are separated by a tunnel barrier insulating layer 416. The MTJs 410 are coupled or connected to a top metal 418 by a via interconnect 420 and a bottom metal (not shown). The inductor and transformer regions 404, 406 are formed from deposits, or portions, of metal 460 coupled or connected to each other by via interconnects 462.

As shown, the MTJ 410 layering can be extended (e.g., via a suitable masking pattern) to cover one or more magnetic circuit elements such as the inductor and transformer regions 404, 406, thereby providing each with an integrated magnetic film 450. In the design of FIG. 4, the magnetic film 450 includes a first magnetic layer 452 corresponding to the first magnetic layer 412 of the MTJ 410, a second magnetic layer 454 corresponding to the second magnetic layer 414 of the MTJ 410, and an insulating layer 456 corresponding to the tunnel barrier insulating layer 416 of the MTJ 410. A cap film insulating layer 458 can also be formed as part of the magnetic film 450 to provide additional isolation from other layers. It will be appreciated that in other designs, it may be desirable to limit the integrated magnetic film 450 to a single magnetic layer, e.g., magnetic layer 452. This may also be achieved with a suitable patterning mask. As discussed above, the integrated magnetic film 450 increases the permeability of corresponding magnetic circuit elements, which can allow for a reduction of their respective sizes and/or an increase in their respective efficiencies.

Accordingly, the design of FIG. 4 allows the magnetic film deposition process to be shared between the MTJ 410 and the integrated magnetic film 450. In addition, one or more magnetic annealing processes used to set the magnetic moment of various magnetic materials may also be shared between the MTJ 410 and the integrated magnetic film 450. The magnetic film 450 can thus be formed in the same or a comparable number of processing steps as forming the MTJ 410 alone. Process efficiency is therefore improved by reducing manufacturing complexity such as the number of processing steps, types of materials, the sharing of process steps and materials, etc.

In some designs, the MRAM processing can be used to provide other magnetic films outside of the MTJ plane.

Figure 5:
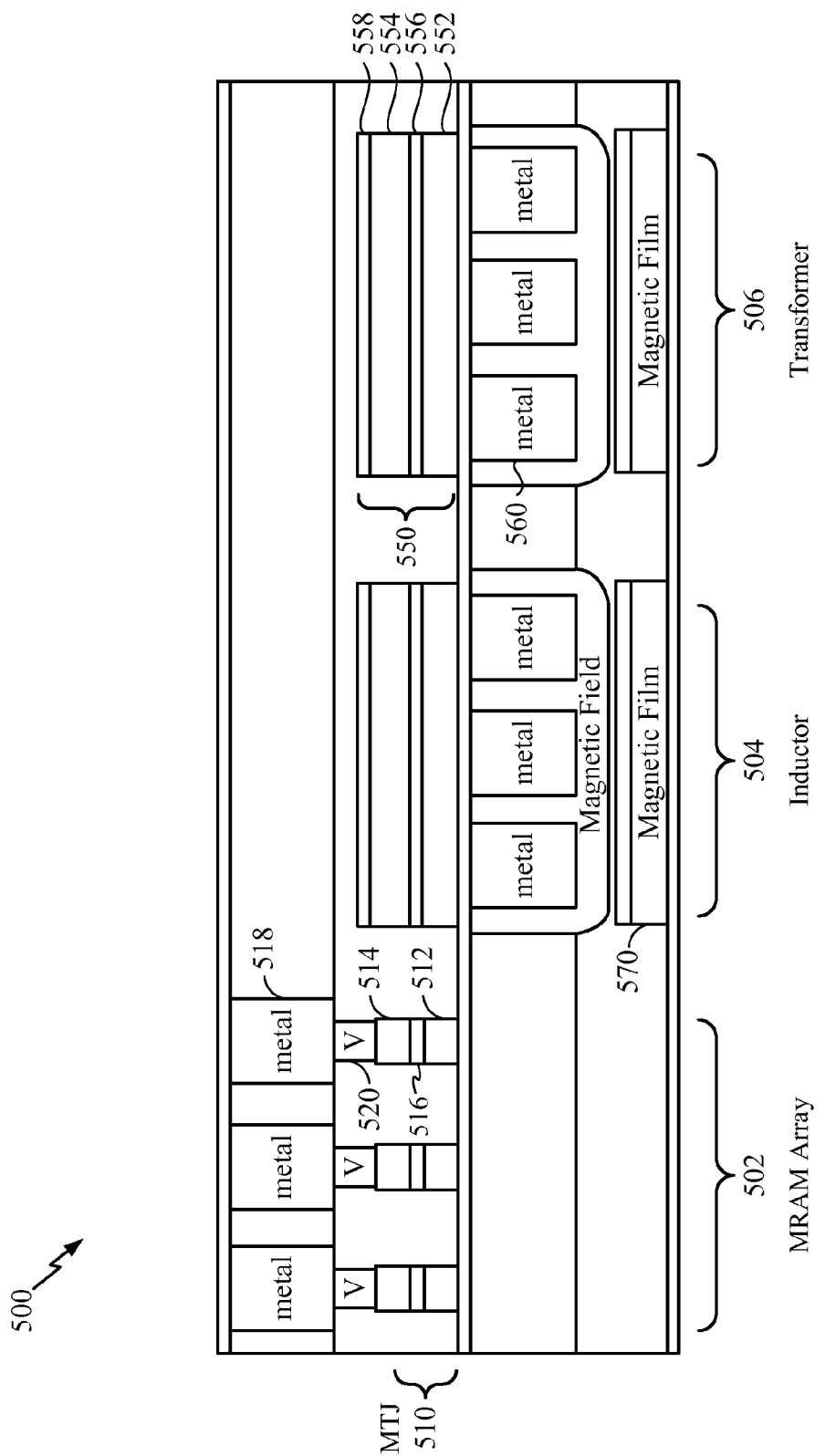
FIG. 5 illustrates an integrated circuit including an example MRAM array region, inductor region, and transformer region with a shared magnetic layer as well as a second integrated magnetic layer.

FIG. 5 illustrates an integrated circuit 500 including an example MRAM array region 502, inductor region 504, and transformer region 506 with a shared magnetic layer as well as a second integrated magnetic layer. Like the design of FIG. 4, the MRAM array region 502 can include one or more MTJs 510 formed from a first magnetic layer 512 and a second magnetic layer 514. The first and second magnetic layers 512, 514 are separated by a tunnel barrier insulating layer 516. The MTJs 510 are coupled or connected to a top metal 518 by a via interconnect 520 and a bottom metal (not shown). The inductor and transformer regions 504, 506 are formed from deposits, or portions, of metal 560 coupled or connected to each other by via interconnects (not shown). An integrated magnetic film 550 is provided through shared magnetic film processing with the MTJ 510, and includes a first magnetic layer 552 corresponding to the first magnetic layer 512 of the MTJ 510, a second magnetic layer 554 corresponding to the second magnetic layer 514 of the MTJ 510, and an insulating layer 556 corresponding to the tunnel barrier insulating layer 516 of the MTJ 510. A cap film insulating layer 558 can also be formed as part of the magnetic film 550 to provide additional isolation from other layers.

The design of FIG. 5, however, additionally includes a second magnetic film 570 formed beneath the inductor region 504 and transformer region 506. As shown, the second magnetic film 570 may include a cap film insulating layer similar to cap film insulating layer 558. While the "upper" magnetic film 550 generally has a more pronounced effect on magnetic permeability of the corresponding magnetic circuit elements due to its closer proximity, the additional "lower" magnetic film 570 provides further improvement to the permeability of the corresponding magnetic circuit elements beyond that provided by the upper magnetic film 550 alone. In comparison with the design of FIG. 4, the design of FIG. 5 also allows the magnetic film deposition and annealing processes to be shared between the MTJ 510 and the integrated magnetic film 550, but also takes advantage of preconfigured MRAM processing capabilities to deposit and form an auxiliary magnetic layer, i.e., magnetic film 570. Again, by sharing manufacturing processes, manufacturing complexity such as the number of processing steps, cost, types of materials, etc., can be reduced.

In some designs, the magnetic circuit elements are formed above the MTJ elements, and a lower level integrated magnetic film can be formed coplanar with the MTJs.

Figure 6:
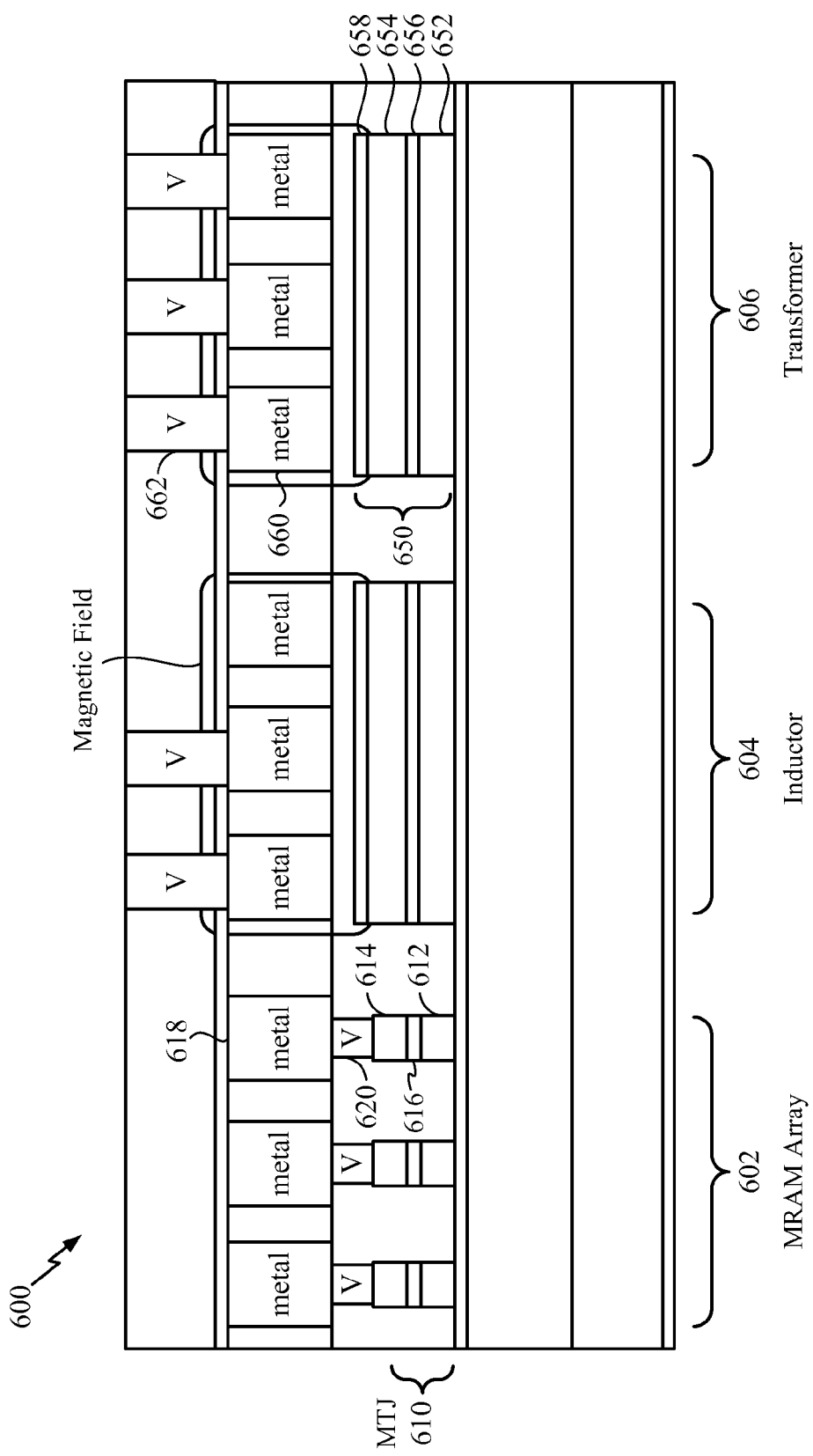
FIG. 6 illustrates an integrated circuit including an example MRAM array region, inductor region, and transformer region with a shared lower magnetic layer.

FIG. 6 illustrates an integrated circuit 600 including an example MRAM array region 602, inductor region 604, and transformer region 606 with a shared lower magnetic layer. Like the design of FIG. 4, the MRAM array region 602 can include one or more MTJs 610 formed from a first magnetic layer 612 and a second magnetic layer 614. The first and second magnetic layers 612, 614 are separated by a tunnel barrier insulating layer 616. The MTJs 610 are coupled or connected to a top metal 618 by a via interconnect 620 and a bottom metal (not shown). The inductor and transformer regions 604, 606 are formed from deposits, or portions, of metal 660 coupled or connected to each other by via interconnects 662. An integrated magnetic film 650 is provided through shared magnetic film processing with the MTJ 610, and includes a first magnetic layer 652 corresponding to the first magnetic layer 612 of the MTJ 610, a second magnetic layer 654 corresponding to the second magnetic layer 614 of the MTJ 610, and an insulating layer 656 corresponding to the tunnel barrier insulating layer 616 of the MTJ 610. A cap film insulating layer 658 can also be formed as part of the magnetic film 650 to provide additional isolation from other layers.

In the design of FIG. 6, however, the integrated magnetic film 650 is formed as a lower layer underlying the inductor and transformer regions 604, 606. Like the design of FIG. 4, the design of FIG. 6 allows the magnetic film deposition process to be shared between the MTJ 610 and the integrated magnetic film 650. In addition, one or more magnetic annealing processes used to set the magnetic moment of various magnetic materials may also be shared between the MTJ 610 and the integrated magnetic film 650. The magnetic film 650 can thus be formed in the same or a comparable number of processing steps as forming the MTJ 610 alone. Process efficiency is therefore improved by reducing manufacturing complexity such as the number of processing steps, cost, types of materials, etc.

In some designs, the lower layer integrated magnetic film coplanar to the MTJ can be combined with an upper layer integrated magnetic film.

Figure 7:
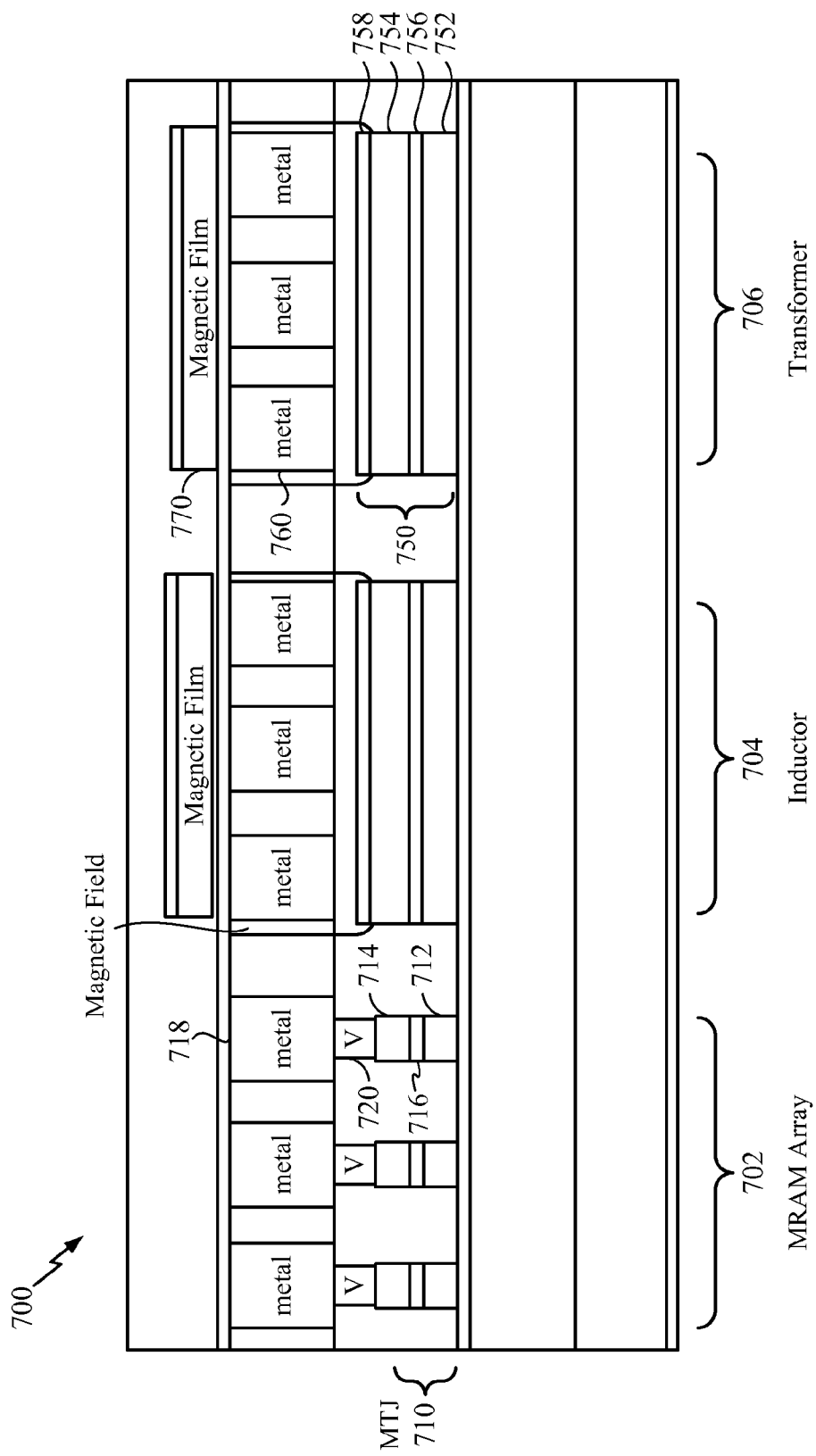
FIG. 7 illustrates an integrated circuit including an example MRAM array region, inductor region, and transformer region with a shared lower magnetic layer as well as a second, upper magnetic layer.

FIG. 7 illustrates an integrated circuit 700 including an example MRAM array region 702, inductor region 704, and transformer region 706 with a shared lower magnetic layer as well as a second, upper magnetic layer. The design of FIG. 7 is similar to the design of FIG. 5, except that the positions of the shared magnetic layer and non-shared magnetic layer are switched. Accordingly, like the design of FIG. 5, the MRAM array region 702 can include one or more MTJs 710 formed from a first magnetic layer 712 and a second magnetic layer 714. The first and second magnetic layers 712, 714 are separated by a tunnel barrier insulating layer 716. The MTJs 710 are coupled or connected to a top metal 718 by a via interconnect 720 and a bottom metal (not shown). The inductor and transformer regions 704, 706 are formed from deposits, or portions, of metal 760 coupled or connected to each other by via interconnects (not shown). An integrated magnetic film 750 is provided through shared magnetic film processing with the MTJ 710, and includes a first magnetic layer 752 corresponding to the first magnetic layer 712 of the MTJ 710, a second magnetic layer 754 corresponding to the second magnetic layer 714 of the MTJ 710, and an insulating layer 756 corresponding to the tunnel barrier insulating layer 716 of the MTJ 710. A cap film insulating layer 758 can also be formed as part of the magnetic film 750 to provide additional isolation from other layers. In addition, a second magnetic film 770 is provided above the inductor region 704 and transformer region 706. As shown, the second magnetic film 770 may include a cap film insulating layer similar to cap film insulating layer 758. Again, when provided together, the upper magnetic film 770 and lower magnetic film 750 provide enhanced permeability improvement for the corresponding magnetic circuit elements beyond that of either film alone. Similar to the design of FIG. 5, the design of FIG. 7 allows the magnetic film deposition and annealing processes to be shared between the MTJ 710 and the integrated magnetic film 750, and also takes advantage of preconfigured MRAM processing capabilities to deposit and form an auxiliary layer, i.e., magnetic film 770. Again, by combining manufacturing processes, manufacturing complexity such as the number of processing steps, cost, types of materials, etc., can be reduced.

In some designs, preconfigured MRAM processing capabilities can be used to manufacture various integrated magnetic films for one or more magnetic elements without an accompanying MTJ plane film.

Figure 8:
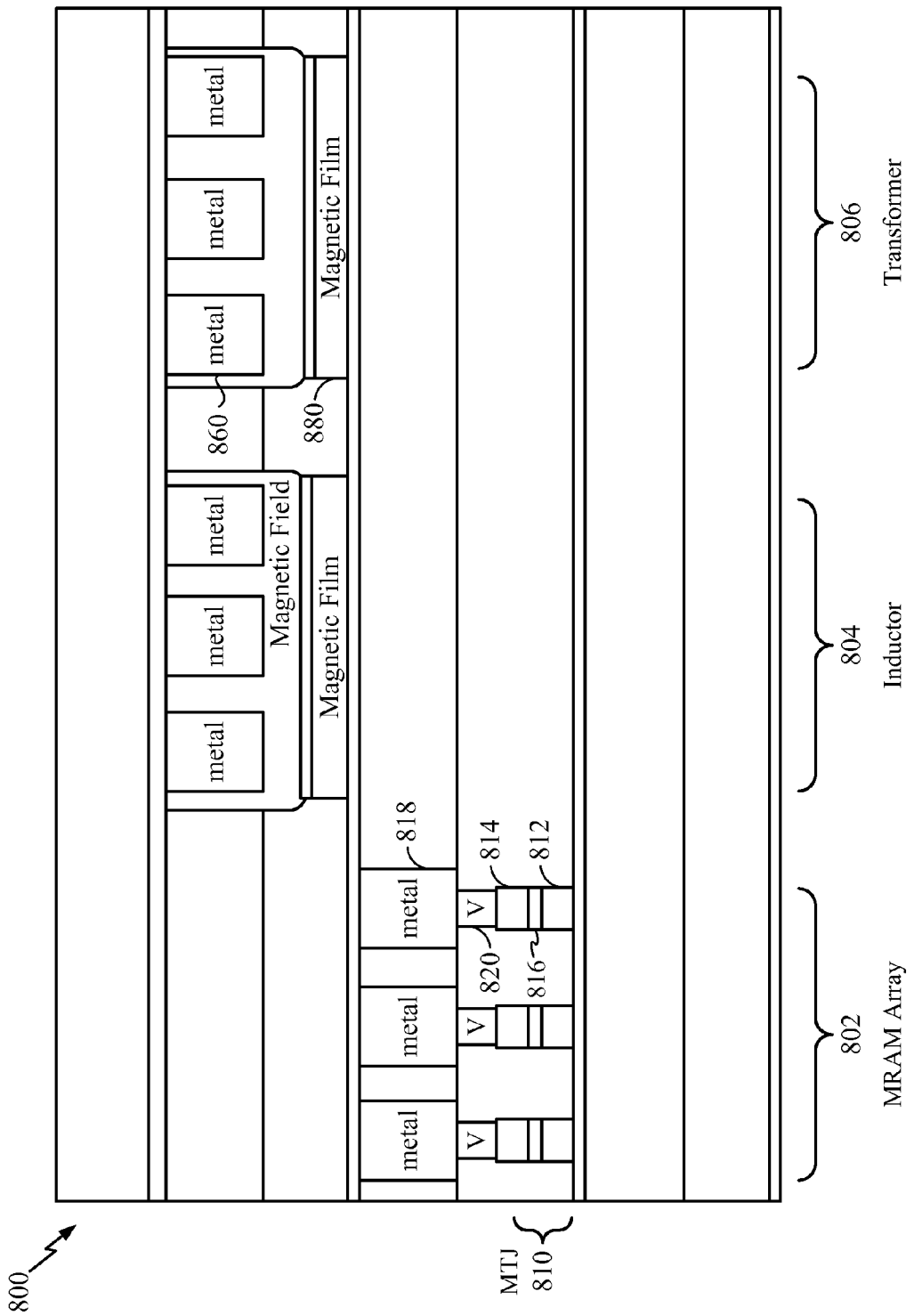
FIG. 8 illustrates an integrated circuit including an example MRAM array region, inductor region, and transformer region with a lone lower integrated magnetic layer.

FIG. 8 illustrates an integrated circuit 800 including an example MRAM array region 802, inductor region 804, and transformer region 806 with a lone lower integrated magnetic layer. Like the previous designs, the MRAM array region 802 can include one or more MTJs 810 formed from a first magnetic layer 812 and a second magnetic layer 814. The first and second magnetic layers 812, 814 are separated by a tunnel barrier insulating layer 816. The MTJs 810 are coupled or connected to a top metal 818 by a via interconnect 820 and a bottom metal (not shown). The inductor and transformer regions 804, 806 are formed from deposits, or portions, of metal 860 coupled or connected to each other by via interconnects (not shown). A lower layer integrated magnetic film 880 is provided below the inductor region 804 and transformer region 806. As shown, the integrated magnetic film 880 may include a cap film insulating layer. The lower magnetic film 880 provides permeability improvement for the corresponding magnetic circuit elements. The design of FIG. 8 takes advantage of preconfigured MRAM processing capabilities to deposit and form an auxiliary magnetic layer, i.e., magnetic film 880. Again, by sharing manufacturing processes, manufacturing complexity such as the number of processing steps, types of materials, etc., can be reduced.

Figure 9:
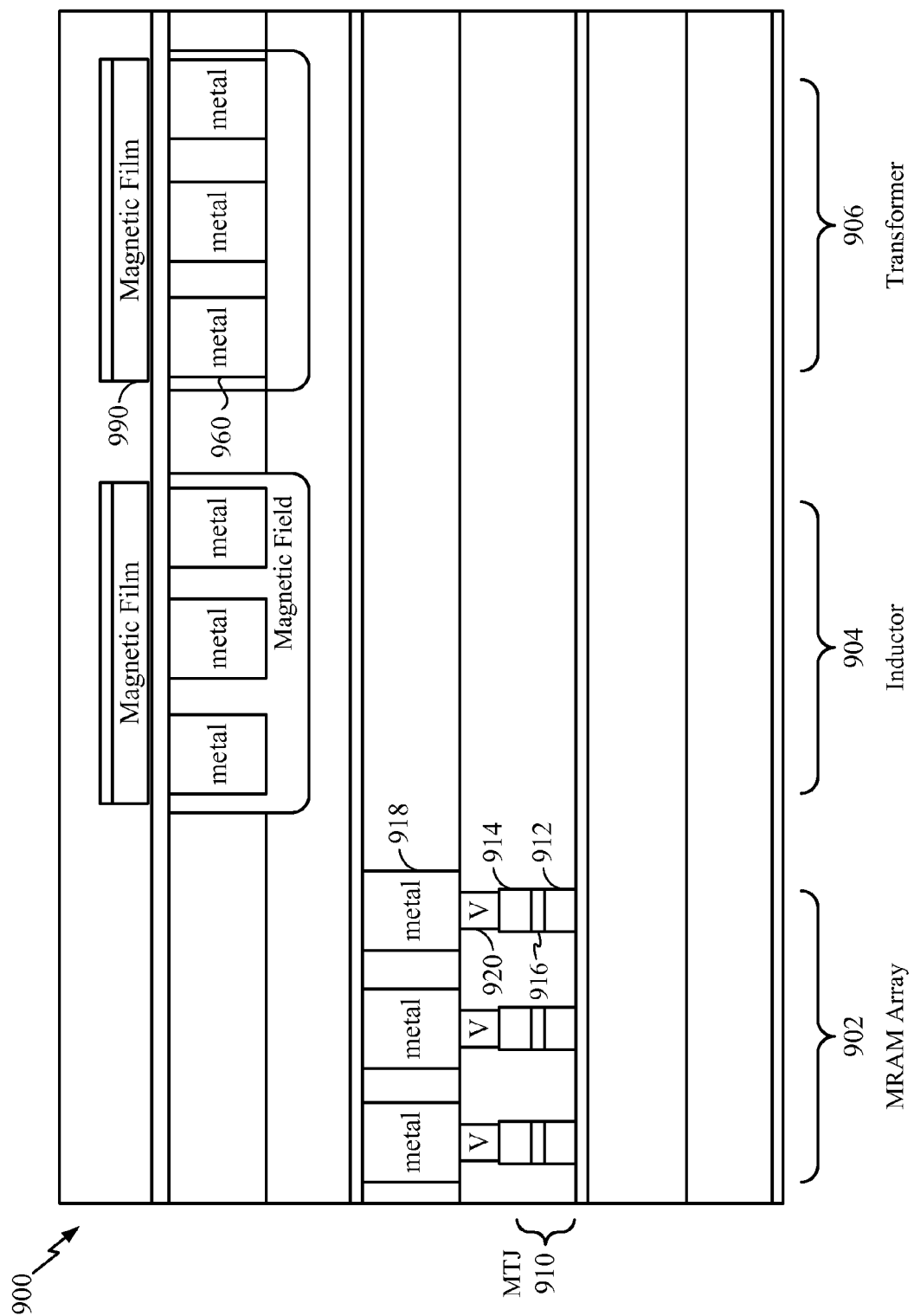
FIG. 9 illustrates an integrated circuit including an example MRAM array region, inductor region, and transformer region with a lone upper integrated magnetic layer.

FIG. 9 illustrates an integrated circuit 900 including an example MRAM array region 902, inductor region 904, and transformer region 906 with a lone upper integrated magnetic layer. Like the previous designs, the MRAM array region 902 can include one or more MTJs 910 formed from a first magnetic layer 912 and a second magnetic layer 914. The first and second magnetic layers 912, 914 are separated by a tunnel barrier insulating layer 916. The MTJs 910 are coupled or connected to a top metal 918 by a via interconnect 920 and a bottom metal (not shown). The inductor and transformer regions 904, 906 are formed from deposits, or portions, of metal 960 coupled or connected to each other by via interconnects (not shown). An upper layer integrated magnetic film 990 is provided above the inductor region 904 and transformer region 906. As shown, the integrated magnetic film 990 may include a cap film insulating layer. The upper magnetic film 990 provides permeability improvement for the corresponding magnetic circuit elements. The design of FIG. 9 takes advantage of preconfigured MRAM processing capabilities to deposit and form an auxiliary magnetic layer, i.e., magnetic film 990. Again, by sharing manufacturing processes, manufacturing complexity such as the number of processing steps, types of materials, etc., can be reduced.

Figure 10:
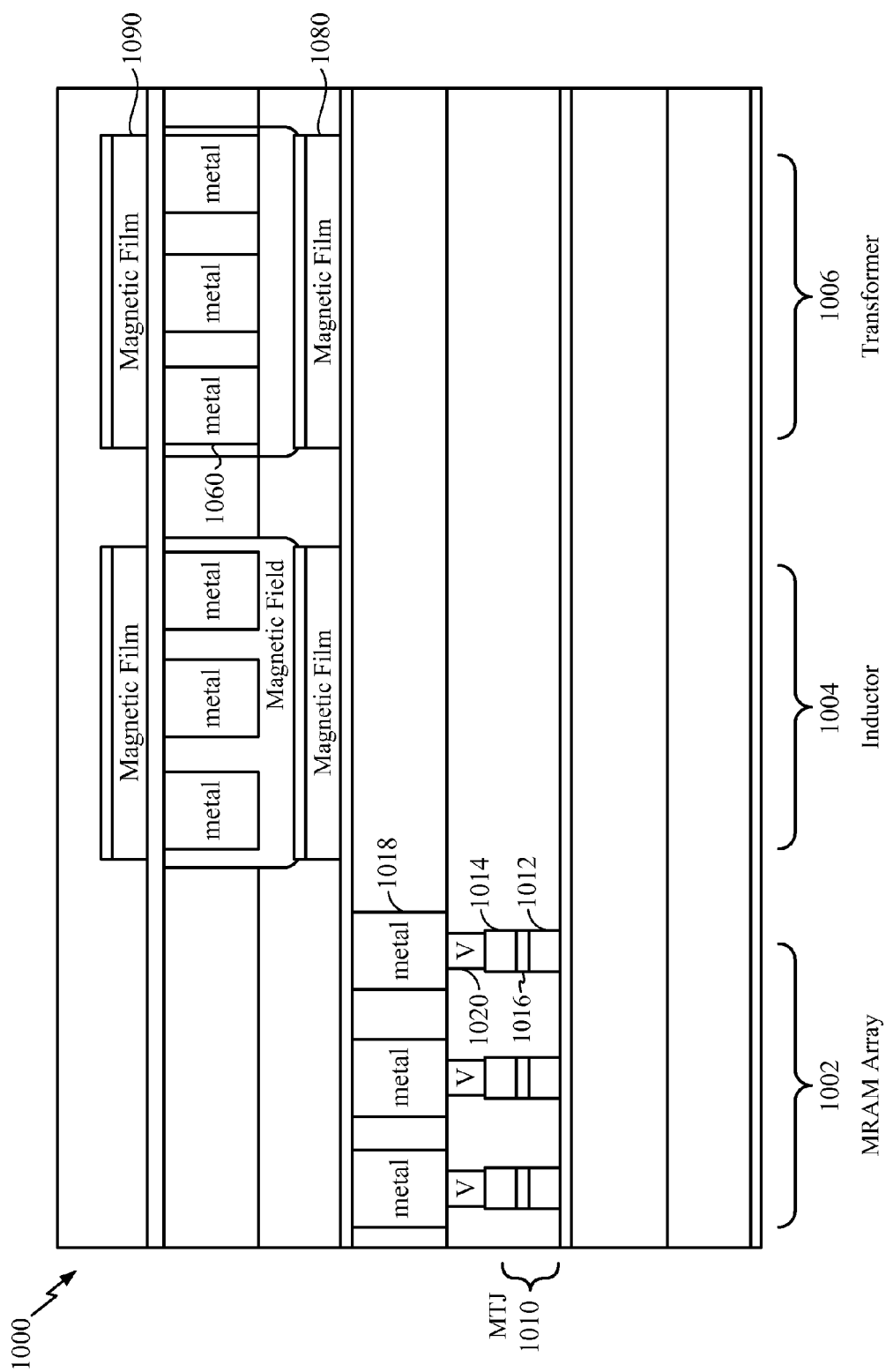
FIG. 10 illustrates an integrated circuit including an example MRAM array region, inductor region, and transformer region with both an upper and lower integrated magnetic layer.

FIG. 10 illustrates an integrated circuit 1000 including an example MRAM array region 1002, inductor region 1004, and transformer region 1006 with both an upper and lower integrated magnetic layer. Like the previous designs, the MRAM array region 1002 can include one or more MTJs 1010 formed from a first magnetic layer 1012 and a second magnetic layer 1014. The first and second magnetic layers 1012, 1014 are separated by a tunnel barrier insulating layer 1016. The MTJs 1010 are coupled or connected to a top metal 1018 by a via interconnect 1020 and a bottom metal (not shown). The inductor and transformer regions 1004, 1006 are formed from deposits, or portions, of metal 1060 coupled or connected to each other by via interconnects (not shown). An upper layer integrated magnetic film 1090 is provided above the inductor region 1004 and transformer region 1006, and a lower layer integrated magnetic film 1080 is provided below the inductor region 1004 and transformer region 1006. As shown, each integrated magnetic film 1080, 1090 may include a cap film insulating layer. When provided together, the upper magnetic and lower magnetic films 1090, 1080 provide enhanced permeability improvement for the corresponding magnetic circuit elements beyond that of either film alone. The design of FIG. 10 takes advantage of preconfigured MRAM processing capabilities to deposit and form multiple auxiliary magnetic layers, i.e., magnetic films 1080, 1090. Again, by sharing manufacturing processes, manufacturing complexity such as the number of processing steps, types of materials, etc., can be reduced.

Figure 11:
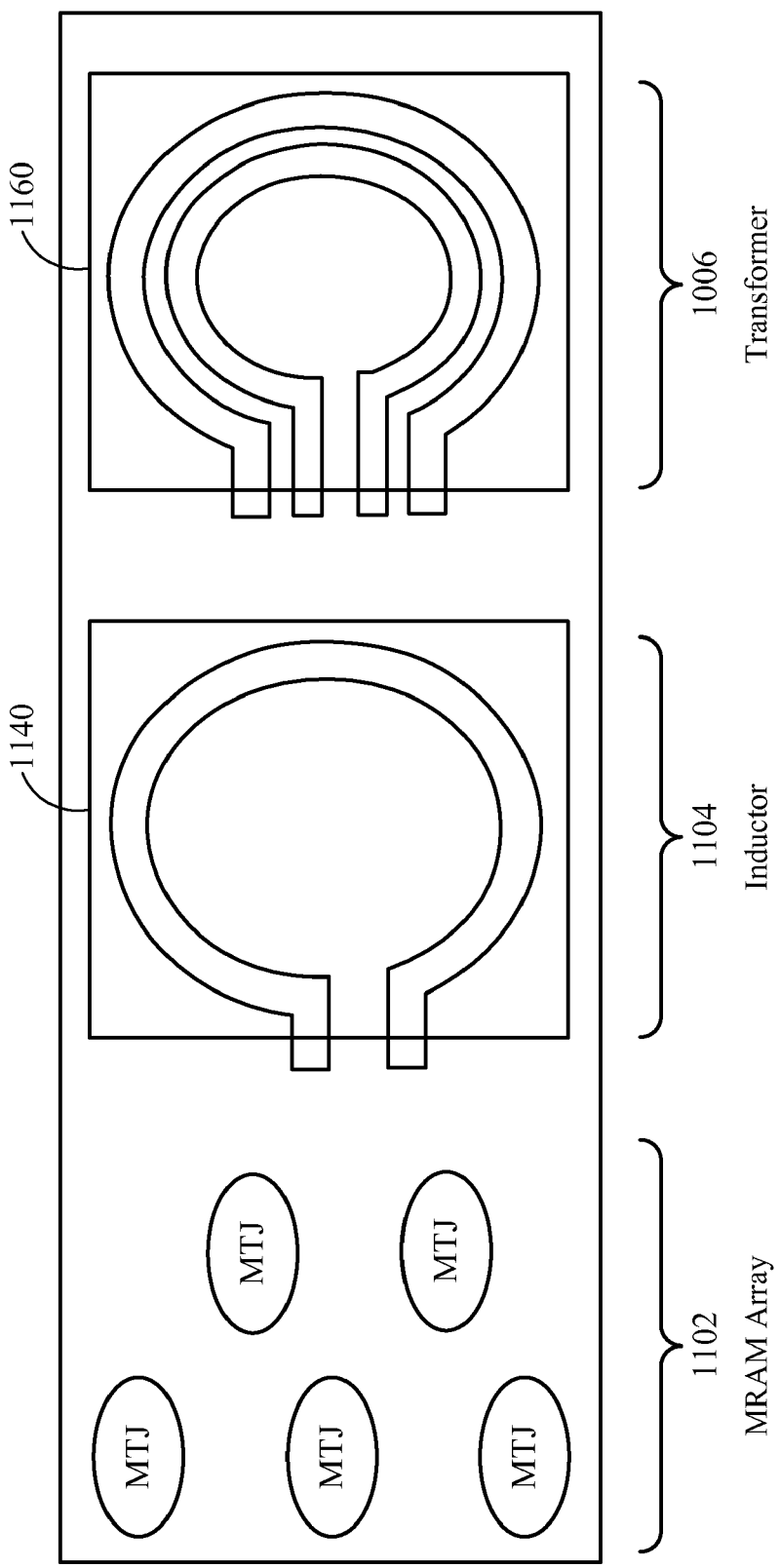
FIG. 11 is a top view diagram of an integrated circuit including an example MRAM array region, inductor region, and transformer region.

FIG. 11 is a top view diagram of an integrated circuit 1100 including an example MRAM array region 1102, inductor region 1104, and transformer region 1106. As shown, the integrated magnetic film layers may be formed as single plates 1140, 1160 covering and/or underlying the inductor region 1104 and transformer region 1106, respectively.

In some designs, however, it is desirable to form each magnetic layer or each magnetic film as a series of magnetic strips arranged in a predefined pattern. The magnetic strips can be shape anisotropic to increase the intrinsic magnetic moment. Moreover, relatively small magnetic strips can reduce eddy current losses by reducing the size of the circuit loop.

Figure 12:
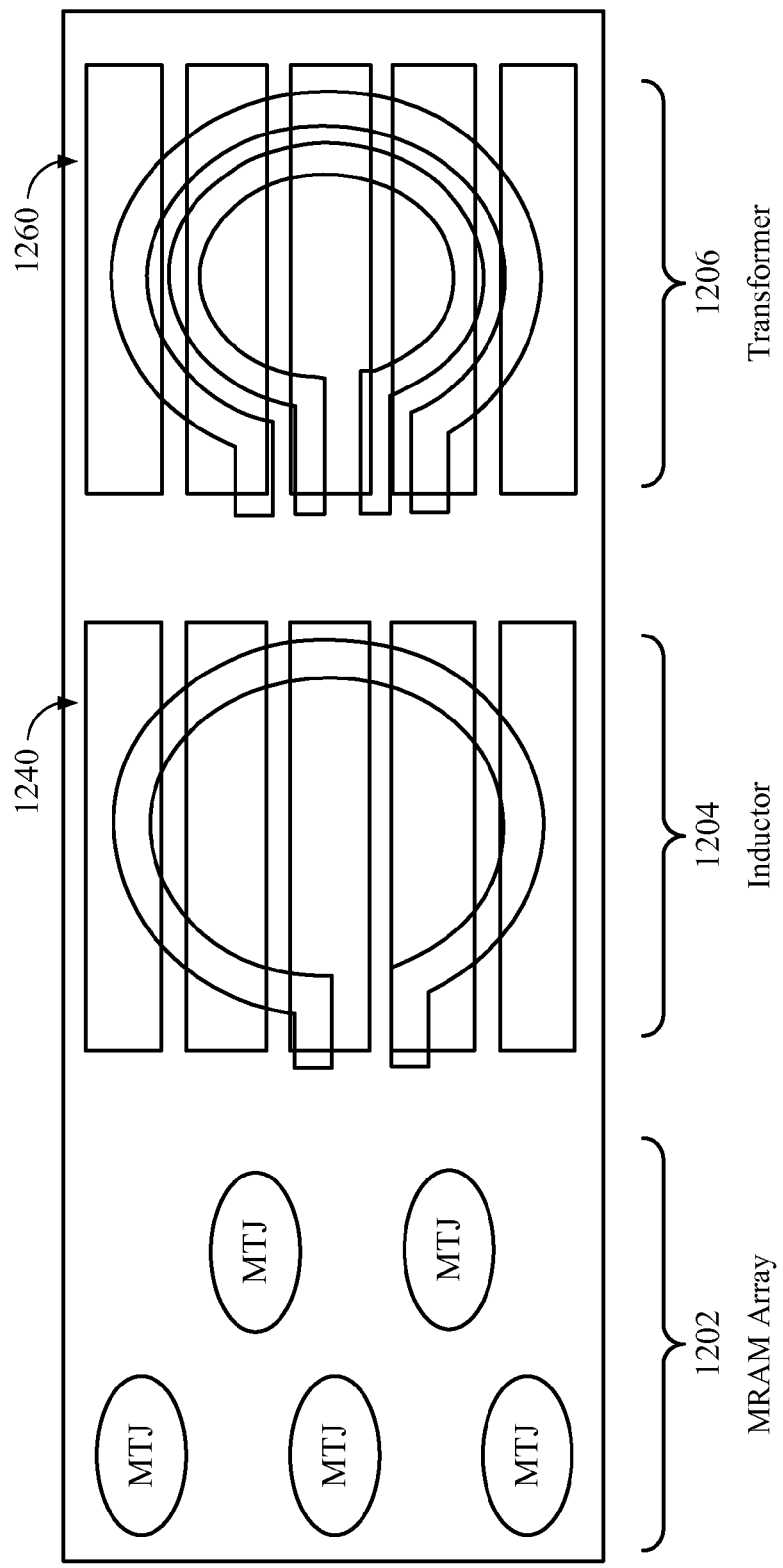
FIG. 12 is a top view diagram of an integrated circuit including an example MRAM array region, inductor region, and transformer region where each integrated magnetic film is formed as a series of magnetic strips arranged in a striped pattern.

FIG. 12 is a top view diagram of an integrated circuit 1200 including an example MRAM array region 1202, inductor region 1204, and transformer region 1206 where each integrated magnetic film 1240, 1260 is formed as a series of magnetic strips arranged in a striped pattern. In the design of FIG. 12, the single plates of FIG. 11 are split into multiple anisotropic strips covering and/or underlying the inductor region 1204 and the transformer region 1206. It will be appreciated that the particular number of strips in FIG. 12 are shown for illustration purposes only, and are not to be taken as limiting. The strips of magnetic material can increase inductance and mutual inductance, as well as reduce eddy current losses, leading to enhanced isotropic magnetic flux. When used in conjunction with a transformer, for example, the transformer efficiency can be increased and the energy loss in the magnetic films can be reduced. The magnitude of the effect depends in part on a corresponding aspect ratio of each strip (e.g., length divided by width L/W), as well as the size of the strips and the distance between the strips that lead to a reduction in the circuit loop.

Figure 13:
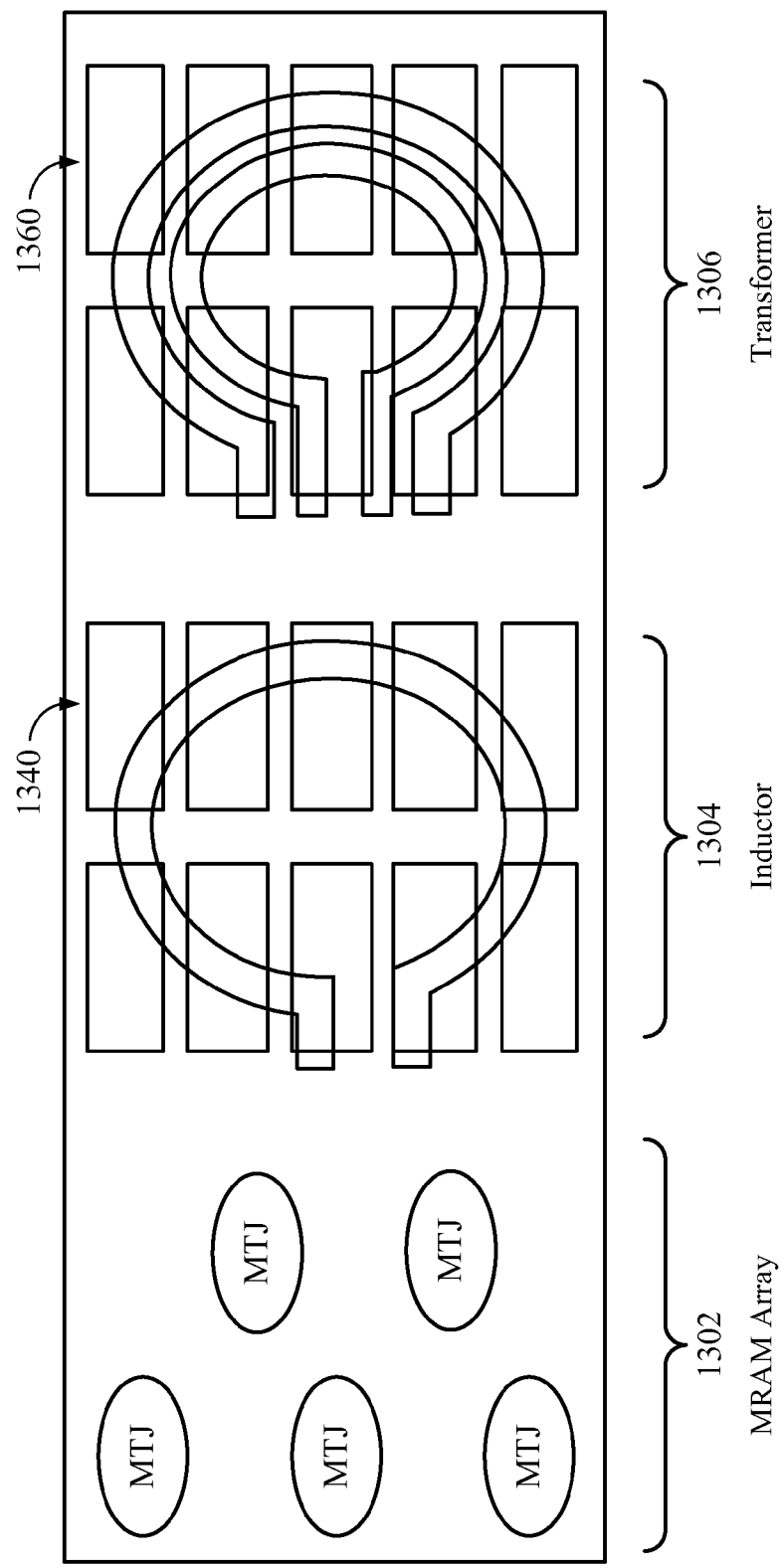
FIG. 13 is a top view diagram of an integrated circuit including an example MRAM array region, inductor region, and transformer region where each integrated magnetic film is formed as a series of magnetic strips arranged in a checkered pattern.

FIG. 13 is a top view diagram of an integrated circuit 1300 including an example MRAM array region 1302, inductor region 1304, and transformer region 1306 where each integrated magnetic film 1340, 1360 is formed as a series of magnetic strips arranged in a checkered pattern. In the design of FIG. 13, each magnetic strip of FIG. 12 is divided in half such that a checkered pattern of magnetic strips covers and/or underlies the inductor region 1304 and the transformer region 1306. Again, it will be appreciated that the particular number of strips and divisions are shown for illustration purposes only, and is not to be taken as limiting. In comparison with the striped pattern of FIG. 12, the checkered pattern of FIG. 13 offers the advantage of even less eddy current loss due to the smaller strips having an even smaller circuit loop.

Figure 14:
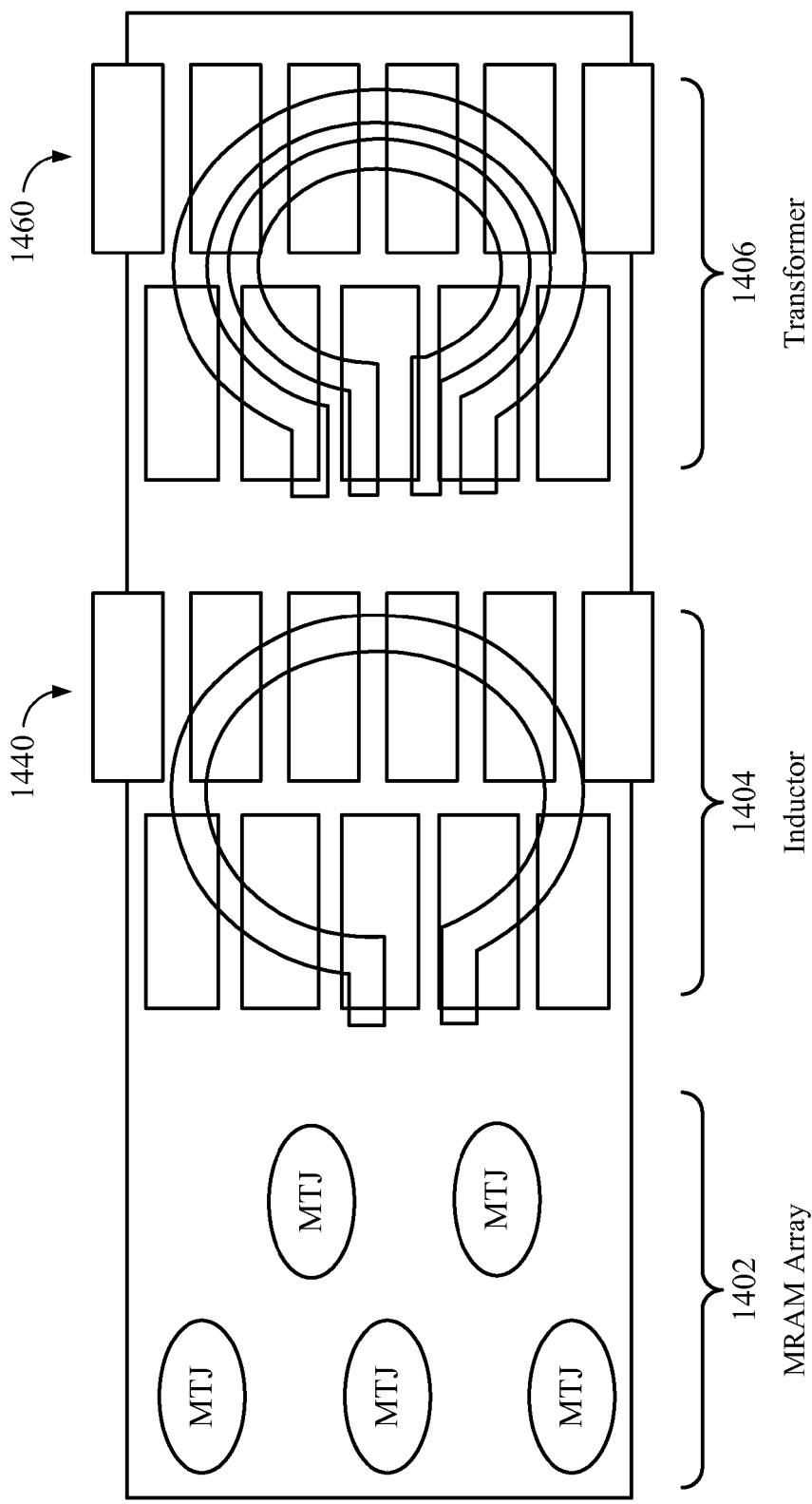
FIG. 14 is a top view diagram of an integrated circuit including an example MRAM array region, inductor region, and transformer region where each integrated magnetic film is formed as a series of magnetic strips arranged in a partially staggered, checkered pattern.

FIG. 14 is a top view diagram of an integrated circuit 1400 including an example MRAM array region 1402, inductor region 1404, and transformer region 1406 where each integrated magnetic film 1440, 1460 is formed as a series of magnetic strips arranged in a partially staggered, checkered pattern. In the design of FIG. 14, the checkered pattern of FIG. 13 is offset between the columns such that a partially staggered, checkered pattern of magnetic strips covers and/or underlies the inductor region 1404 and the transformer region 1406. Again, it will be appreciated that the particular number of strips, divisions, and staggered columns are shown for illustration purposes only, and is not to be taken as limiting. In comparison with the checkered pattern of FIG. 13, the partially staggered, checkered pattern of FIG. 14 may further reduce eddy current loss by redistributing the magnetic field and, hence, the eddy current loop may be changed and reduced.

Figure 15:
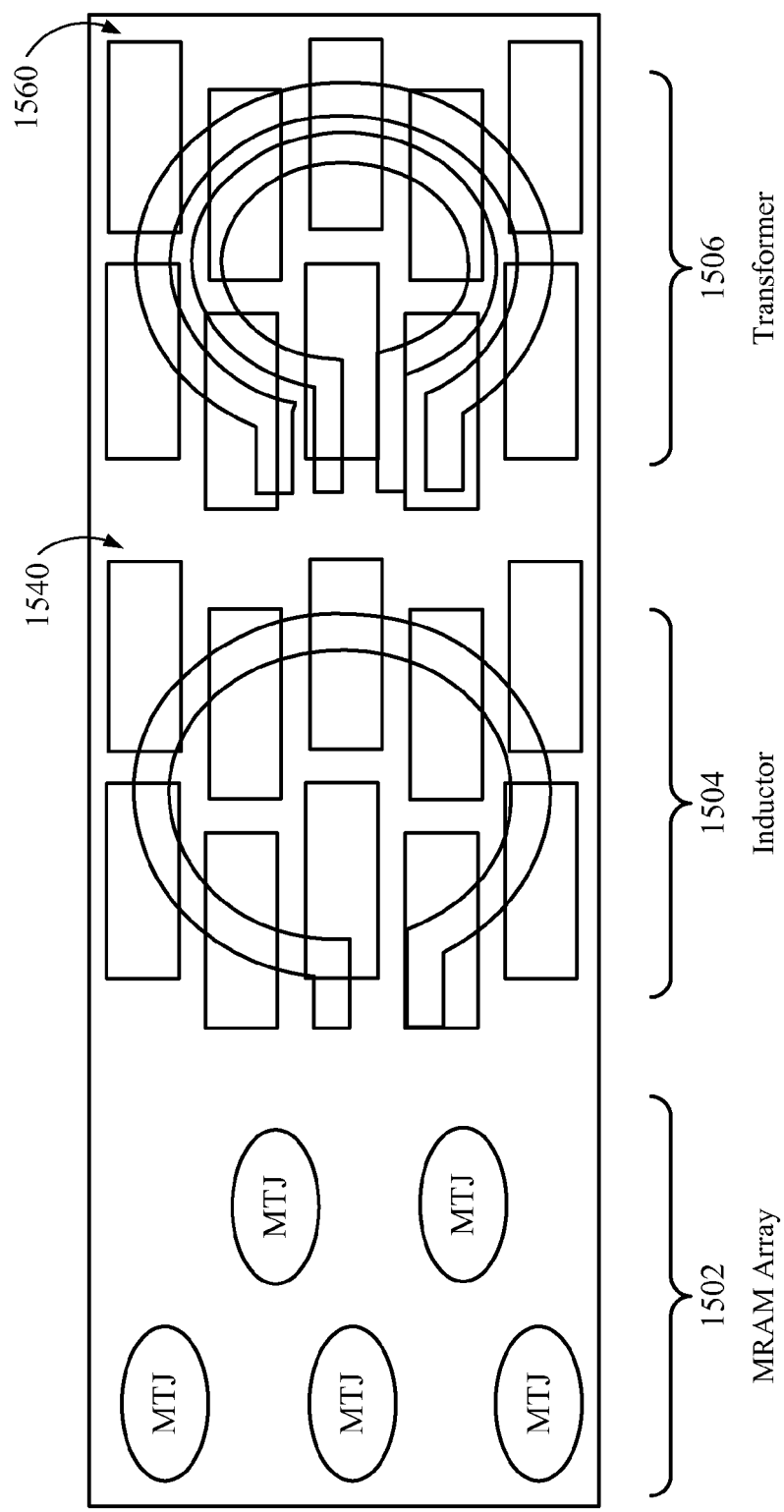
FIG. 15 is a top view diagram of an integrated circuit including an example MRAM array region, inductor region, and transformer region where each integrated magnetic film is formed as a series of magnetic strips arranged in a fully staggered, checkered pattern.

FIG. 15 is a top view diagram of an integrated circuit 1500 including an example MRAM array region 1502, inductor region 1504, and transformer region 1506 where each integrated magnetic film 1540, 1560 is formed as a series of magnetic strips arranged in a fully staggered, checkered pattern. In the design of FIG. 15, the partially staggered, checkered pattern of FIG. 14 is further offset between the rows such that a fully staggered, checkered pattern of magnetic strips covers and/or underlies the inductor region 1404 and the transformer region 1406. Again, it will be appreciated that the particular number of strips, divisions, and staggered columns/rows are shown for illustration purposes only, and is not to be taken as limiting. In comparison with the partially staggered, checkered pattern of FIG. 14, the fully staggered, checkered pattern of FIG. 15 may further redistribute the magnetic field and reduce the eddy current loop.

While the designs of FIGS. 11-15 have been separately described, it will be appreciated that a hybrid design using a combination of two or more of the techniques presented therein may also be employed.

With reference to FIGS. 1-15, exemplary methods of forming MRAM devices with integrated magnetic film enhanced circuit elements will now be described.

Figure 16:
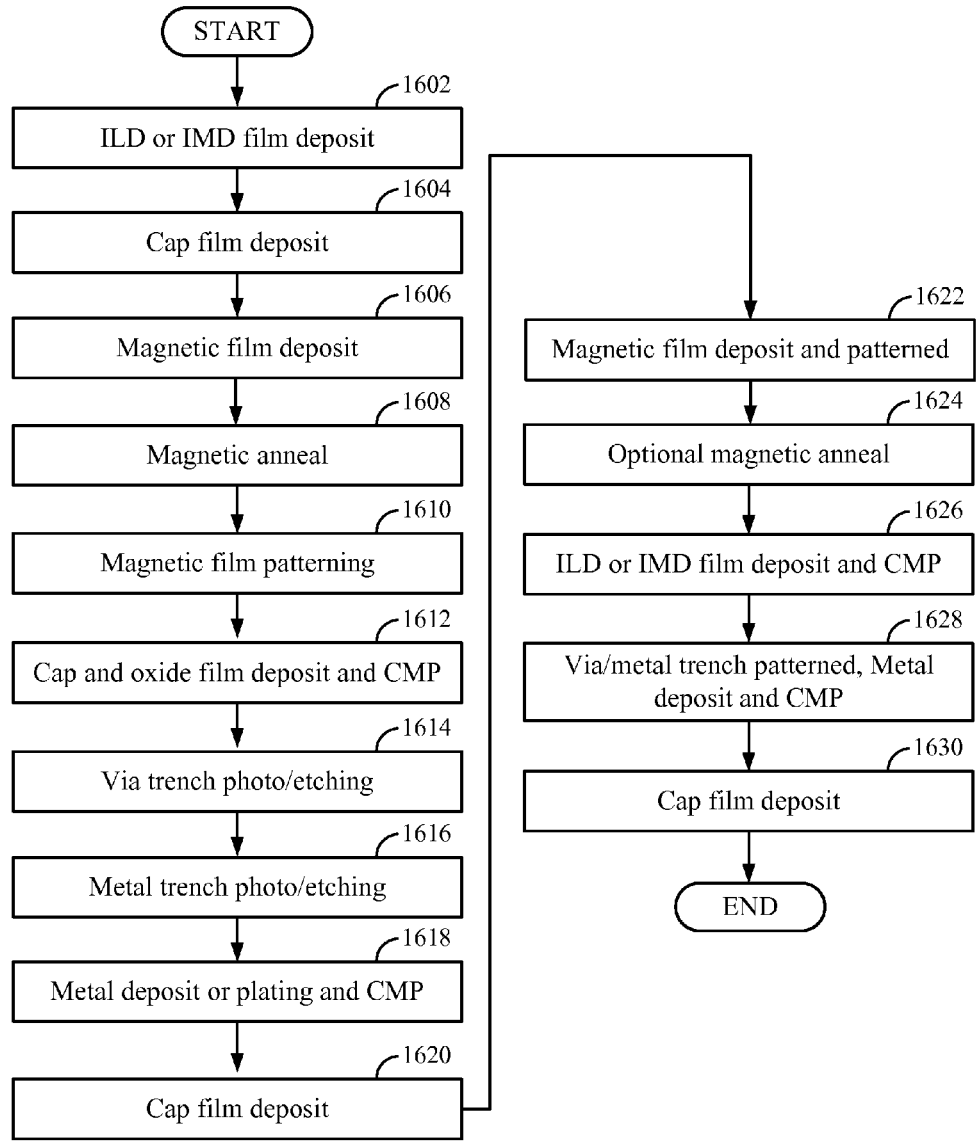
FIG. 16 illustrates an exemplary method of forming an MRAM device with integrated magnetic film enhanced circuit elements.

FIG. 16 illustrates an exemplary method of forming an MRAM device with integrated magnetic film enhanced circuit elements. In particular, FIG. 16 illustrates a method of forming the integrated circuit illustrated in FIG. 7, which has been selected for illustration purposes because the design of FIG. 7 includes a shared lower magnetic layer as well as a second, upper magnetic layer. However, it will be appreciated that the techniques presented in FIG. 16 can be easily adapted to other designs.

With reference to FIGS. 7 and 16, an inter layer dielectric (ILD) or inter metal layer dielectric (IMD) can be deposited to provide an isolated platform for the illustrated circuit elements (block 1602). A bottom cap film can be deposited on the ILD or IMD as an added metal diffusion barrier (block 1604). A first magnetic material layer, tunnel barrier layer, and second magnetic material layer can be deposited to form the first magnetic layer 712, the second magnetic layer 714, and tunnel barrier layer 716 of the MTJ 710 as well as the corresponding first magnetic layer 752, second magnetic layer 754, and tunnel barrier layer 756 of the integrated magnetic film 750 (block 1606). Subsequently, a magnetic anneal can be applied to set a desired magnetic moment of the magnetic material (e.g., the desired magnetic moment of the free, first layer 712 of the MTJ 710) (block 1608). Then, magnetic films are patterned to form MTJ 710 and inductor or transformer magnetic films 750 (block 1610). A cap and oxide film are then deposited and a CMP process performed (block 1612). Via trench photo and etching processes are performed next (block 1614), followed by a metal trench patterning process (block 1616). Then, metal deposit or plating and a CMP process are performed to form the via interconnect 720 and metal 718, 760 (block 1618). Once the MTJ 710 is formed and interconnection is completed, a cap film is deposited (block 1620).

Following the design of FIG. 7, a third magnetic material layer can be deposited and patterned to form the upper integrated magnetic film 770 (block 1622). A subsequent, optional magnetic anneal can be applied if desired (block 1624). Then, an ILD or IMD film can be deposited and a CMP process can be performed (block 1626). Next, a via/metal trench is patterned, metal is deposited, and a CMP process can be performed (block 1628). Finally, a cap film is deposited (block 1630).

It will be appreciated that the integrated circuits provided herein may be included within a mobile phone, portable computer, hand-held personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments of the disclosure may be suitably employed in any device which includes active integrated circuitry including memory and on-chip circuitry for test and characterization.

The foregoing disclosed devices and methods are typically designed and are configured into GDSII and GERBER computer files, stored on a computer readable storage media. These files are in turn provided to fabrication handlers who fabricate devices based on these files. The resulting products are semiconductor wafers that are then cut into semiconductor die and packaged into a semiconductor chip. The chips are then employed in devices described above.

Those of skill in the art will appreciate that the disclosed embodiments are not limited to illustrated exemplary structures or methods, and any means for performing the functionality described herein are included in the embodiments.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the disclosed embodiments may be described or claimed in the singular, the plural is contemplated unless limitation to the singular is explicitly stated.

What is claimed is:
1. A Magnetoresistive Random Access Memory integrated circuit, the integrated circuit comprising:
   a substrate;
   a magnetic tunnel junction region disposed on the substrate, the magnetic tunnel junction region comprising a first magnetic layer and a second magnetic layer separated by a tunnel barrier insulating layer;

a magnetic circuit element region disposed on the substrate, the magnetic circuit element region comprising a plurality of interconnected metal portions; and a first integrated magnetic material disposed on the substrate adjacent to the plurality of interconnected metal portions.

2. The integrated circuit of claim 1, wherein the first integrated magnetic material is disposed on the substrate in the same plane as at least one of the first and second magnetic layers of the magnetic tunnel junction.

3. The integrated circuit of claim 1, wherein the first integrated magnetic material is disposed on the substrate in a different plane from the first and second magnetic layers of the magnetic tunnel junction.

4. The integrated circuit of claim 1, wherein the first integrated magnetic material is a magnetic film comprising a first magnetic layer corresponding to and coplanar with the first magnetic layer of the magnetic tunnel junction, a second magnetic layer corresponding to and coplanar with the second magnetic layer of the magnetic tunnel junction, and an insulating layer corresponding to and coplanar with the tunnel barrier insulating layer of the magnetic tunnel junction.

5. The integrated circuit of claim 4, wherein the magnetic film further comprises a cap insulating layer disposed on the second magnetic layer of the magnetic film.

6. The integrated circuit of claim 1, further comprising a second integrated magnetic material disposed on the substrate adjacent to the plurality of interconnected metal portions and isolated from the first integrated magnetic material.

7. The integrated circuit of claim 1, wherein the first integrated magnetic material is formed from a plurality of strips of magnetic material.

8. The integrated circuit of claim 7, wherein the strips of magnetic material are arranged in a striped, checkered, partially staggered, or fully staggered pattern.

9. The integrated circuit of claim 1, wherein the first integrated magnetic material and at least one of the first and second magnetic layers of the magnetic tunnel junction have a common magnetic moment from a shared magnetic anneal.

10. The integrated circuit of claim 1, wherein the magnetic circuit element is an inductor or a transformer.

11. The integrated circuit of claim 1 integrated in at least one semiconductor die.

12. The integrated circuit of claim 1 further comprising a device, selected from the group consisting of a set top box, music player, video player, entertainment unit, navigation device, communications device, personal digital assistant (PDA), fixed location data unit, and a computer, into which the integrated circuit is integrated.

13. A method of forming a Magnetoresistive Random Access Memory integrated circuit, the method comprising:
providing a substrate;
depositing and patterning a first magnetic layer, a tunnel barrier insulating layer, and a second magnetic layer to form a magnetic tunnel junction region on the substrate;
depositing and patterning a plurality of interconnected metal portions to form a magnetic circuit element region on the substrate; and
depositing and patterning a first integrated magnetic material on the substrate adjacent to the plurality of interconnected metal portions.

14. The method of claim 13, wherein the first integrated magnetic material and at least one of the first and second magnetic layers of the magnetic tunnel junction are deposited and patterned together on the substrate and in the same plane.

15. The method of claim 13, wherein the first integrated magnetic material and the first and second magnetic layers of the magnetic tunnel junction are deposited and patterned separately on the substrate and in different planes.

16. The method of claim 13, wherein depositing and patterning the first integrated magnetic material comprises forming a magnetic film by depositing and patterning a first magnetic layer corresponding to and coplanar with the first magnetic layer of the magnetic tunnel junction, a second magnetic layer corresponding to and coplanar with the second magnetic layer of the magnetic tunnel junction, and an insulating layer corresponding to and coplanar with the tunnel barrier insulating layer of the magnetic tunnel junction.

17. The method of claim 16, wherein forming the magnetic film further comprises providing a cap insulating layer on the second magnetic layer of the magnetic film.

18. The method of claim 13, further comprising depositing and patterning a second integrated magnetic material on the substrate adjacent to the plurality of interconnected metal portions and isolated from the first integrated magnetic material.

19. The method of claim 13, wherein depositing and patterning the first integrated magnetic material comprises forming a plurality of strips of magnetic material.

20. The method of claim 19, wherein depositing and patterning the first integrated magnetic material further comprises arranging the strips of magnetic material in a striped, checkered, partially staggered, or fully staggered pattern.

21. The method of claim 13, further comprising applying a shared magnetic anneal to the first integrated magnetic material and at least one of the first and second magnetic layers of the magnetic tunnel junction to provide a common magnetic moment.

22. The method of claim 13, wherein the magnetic circuit element is an inductor or a transformer.

23. A Magnetoresistive Random Access Memory integrated circuit, the integrated circuit comprising:
a substrate;
a magnetic tunnel junction region disposed on the substrate, the magnetic tunnel junction region comprising a first magnetic layer and a second magnetic layer separated by a tunnel barrier insulating layer;
a magnetic circuit element region disposed on the substrate, the magnetic circuit element region comprising a plurality of interconnected metal portions; and
first magnetic means for concentrating a magnetic field, the first magnetic means disposed on the substrate adjacent to the plurality of interconnected metal portions.

24. The integrated circuit of claim 23, wherein the first magnetic means is disposed on the substrate in the same plane as at least one of the first and second magnetic layers of the magnetic tunnel junction.

25. The integrated circuit of claim 23, further comprising a second magnetic means for concentrating a magnetic field, the second magnetic means disposed on the substrate adjacent to the plurality of interconnected metal portions and isolated from the first magnetic means.

26. The integrated circuit of claim 23, wherein the first means is divided into a plurality of strips isolated from each other.

27. The integrated circuit of claim 23, wherein the first magnetic means and at least one of the first and second magnetic layers of the magnetic tunnel junction have a common magnetic moment from a shared magnetic anneal.

28. A method of forming a Magnetoresistive Random Access Memory integrated circuit, the method comprising:
step for providing a substrate;

step for depositing and patterning a first magnetic layer, a tunnel barrier insulating layer, and a second magnetic layer to form a magnetic tunnel junction region on the substrate;

step for depositing and patterning a plurality of interconnected metal portions to form a magnetic circuit element region on the substrate; and step for depositing and patterning a first integrated magnetic material on the substrate adjacent to the plurality of interconnected metal portions.

29. The method of claim 28, wherein the step for depositing and patterning the first integrated magnetic material comprises step for forming a magnetic film by depositing and patterning a first magnetic layer corresponding to and coplanar with the first magnetic layer of the magnetic tunnel junction, a second magnetic layer corresponding to and coplanar with the second magnetic layer of the magnetic tunnel junction, and an insulating layer corresponding to and coplanar with the tunnel barrier insulating layer of the magnetic tunnel junction.

30. The method of claim 28, further comprising step for depositing and patterning a second integrated magnetic material on the substrate adjacent to the plurality of interconnected metal portions and isolated from the first integrated magnetic material.

31. The method of claim 28, wherein the step for depositing and patterning the first integrated magnetic material comprises step forming a plurality of strips of magnetic material.

32. The method of claim 28, further comprising step for applying a shared magnetic anneal to the first integrated magnetic material and at least one of the first and second magnetic layers of the magnetic tunnel junction to provide a common magnetic moment.

* * * * *